United States Patent
Rand et al.

(10) Patent No.: US 7,947,897 B2
(45) Date of Patent: May 24, 2011

(54) ORGANIC PHOTOVOLTAIC CELLS UTILIZING ULTRATHIN SENSITIZING LAYER

(75) Inventors: Barry P. Rand, Princeton, NJ (US); Stephen R. Forrest, Princeton, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 630 days.

(21) Appl. No.: 11/263,865

(22) Filed: Nov. 2, 2005

(65) Prior Publication Data

US 2007/0096085 A1 May 3, 2007

(51) Int. Cl.
*H01L 31/00* (2006.01)
(52) U.S. Cl. .......................................... 136/263
(58) Field of Classification Search .................. None
See application file for complete search history.

(56) References Cited

U.S. PATENT DOCUMENTS

| | | | |
|---|---|---|---|
| 5,201,961 A | 4/1993 | Yoshikawa et al. | |
| 5,350,459 A * | 9/1994 | Suzuki et al. ................. | 136/263 |
| 6,333,458 B1 | 12/2001 | Forrest et al. | |
| 6,352,777 B1 | 3/2002 | Bulovic et al. | |
| 6,420,031 B1 | 7/2002 | Parthasarathy et al. | |
| 6,420,430 B1 | 7/2002 | Linz et al. | |
| 6,440,769 B2 | 8/2002 | Peumans et al. | |
| 6,451,415 B1 | 9/2002 | Forrest et al. | |
| 6,580,027 B2 | 6/2003 | Forrest et al. | |
| 6,657,378 B2 | 12/2003 | Forrest et al. | |
| 2003/0042846 A1* | 3/2003 | Forrest et al. ................. | 313/503 |
| 2003/0127967 A1 | 7/2003 | Tsutsui et al. | |
| 2005/0110007 A1 | 5/2005 | Forrest et al. | |
| 2005/0224113 A1 | 10/2005 | Xue et al. | |
| 2005/0266218 A1 | 12/2005 | Peumans et al. | |
| 2006/0027802 A1 | 2/2006 | Forrest et al. | |
| 2006/0032529 A1 | 2/2006 | Rand et al. | |
| 2007/0096085 A1 | 5/2007 | Rand et al. | |

FOREIGN PATENT DOCUMENTS

| | | |
|---|---|---|
| JP | 2001267077 A | 9/2001 |
| WO | WO 2005/101524 | 10/2005 |

OTHER PUBLICATIONS

S. Uchida, J. Xue, B. Rand, and S. Forrest, Organic small molecule solar cells with homogeneously mixed copper phthalocyanine: C60 active layer, May 24, 2004, Applied Physics Letters, 84 (21) 4218-4220.*

Luque, A. and Hegedus, S., Handbook of Photovoltaic Science and Engineering, 2003, John Wiley & Sons Ltd, 363-365.*

(Continued)

*Primary Examiner* — Alexa D. Neckel
*Assistant Examiner* — Miriam Berdichevsky
(74) *Attorney, Agent, or Firm* — Duane Morris LLP

(57) ABSTRACT

A photosensitive device includes a series of organic photoactive layers disposed between two electrodes. Each layer in the series is in direct contact with a next layer in the series. The series is arranged to form at least one donor-acceptor heterojunction, and includes a first organic photoactive layer comprising a first host material serving as a donor, a thin second organic photoactive layer comprising a second host material disposed between the first and a third organic photoactive layer, and the third organic photoactive layer comprising a third host material serving as an acceptor. The first, second, and third host materials are different. The thin second layer serves as an acceptor relative to the first layer or as a donor relative to the third layer.

24 Claims, 9 Drawing Sheets

OTHER PUBLICATIONS

Peumans et al., "Efficient photon harvesting at high optical intensities in ultrathin organic double-heterostructure photovoltaic diodes," Appl. Phys. Letts. 76: 2650-52, 2000.

Miessler and Tarr, "Inorganic Chemistry" ($2^{nd}$ Edition), Prentice Hall, 1999, pp. iii (contents), 1-3, 422-424, and 442.

Forrest, "The path to ubiquitous and low-cost organic electronic appliances on plastic," Nature 428: 911-918, 2004.

Forrest, "The limits to organic photovoltaic cell efficiency," MRS Bullentin 30(1): 28-32, 2005.

Xue et al., "Asymmetric tandem organic photovoltaic cells with hybrid planar-mixed molecular heterojunctions," Appl. Phys. Letts. 85(23): 5757-5759, 2004.

Wang et al., "Infrared photocurrent spectral response from plastic solar cell with low-band-gap polyfluorene and fullerene derivative", Appl. Phys. Letts. 85(21): 5081-5083, 2004.

Xue et al., "4.2% efficient organic photovoltaic cells with low series resistances", Appl. Phys. Letts. 84(16): 3013-3015, 2004.

Xue et al., "Carrier transport in multilayer organic photodetectors: II. Effects of anode preparation", J. Appl. Phys. 95(4):1869-1877, 2004.

Laudise et al., "Physical vapor growth of organic semiconductors", J. Crystal Growth 187: 449-454, 1998.

Pettersson et al., "Modeling photocurrent action spectra of photovoltaic devices based on organic thin films", J. Appl. Phys. 86(1): 487-496, 1999.

Friedel et al., "A new metal (II) phthalocyanine structure: X-ray and Mössbauer studies of the triclinic tin (II) phthalocyanine", Chemical Communications, 400-401, 1970.

Kubiak et al., "X-ray analysis of phthalocyanines formed in the reaction of Au-Cu and Au-Sn alloys with 1,2-dicyanobenzene", J. Alloys and Compounds 189: 107-111, 1992.

Walzer et al., "STM and STS investigation of ultrathin tin phthalocyanine layers adsorbed on HOPG(0001) and Au(111)", Surf. Sci. 471: 1-10, 2001.

Chen et al., Investigation on structure, spectrum and linear dichroism of SnPc polycrystalline films, Acta Phys. Sin. 45(1): 146-152, 1996.

Pope et al., "Electronic processes in organic crystals and polymers" ($2^{nd}$ Edition), Oxford University Press, New York, 1999 (abstract included only).

Rand et al., "Mixed donor-acceptor molecular heterojunctions for photovoltaic applications. I. material properties", J. Appl. Phys. 98: 124902-1 to 124902-7 (2005).

Brown et al., "Crystal structure of β-copper phthalocyanine", J. Chem. Soc. A, 2488-2493 (1968).

Rand et al., "Long-range absorption enhancement in organic tandem thin-film solar cells containing silver nanoclusters", J. Appl. Phys. 96(12): 7519-7526, 2004.

U.S. Appl. No. 10/915,410, to Rand et al., "Organic Photosensitive Devices," filed Aug. 11, 2004.

U.S. Appl. No. 10/979,145, to Forrest et al., "Stacked Organic Photosensitive Devices," filed Nov. 3, 2004.

U.S. Appl. No. 10/857;747, to Peumans et al., "Aperiodic Dielectric Multilayer Stack," filed Jun. 1, 2004.

Suemori et al., "Organic solar cells protected by very thick naphthalene tetracarboxylic anhydride films," Appl. Phys. Lett. 85(25): pp. 6269-6271, 2004.

Maennig et al., "Organic *p-i-n* solar cells," Appl. Phys. A: Materials Science & Processing 79: pp. 1-14, 2004.

Peumans et al., "Small molecular weight organic thin-film photodetectors and solar cells," Appl. Phys. Rev. 93(7): pp. 3693-3723, 2003.

International Search Report, PCT Application No. PCT/US2006/041990 filed Oct. 26, 2006.

International Search Report for International Application No. PCT/US2007/024651, filed Nov. 29, 2007, date of mailing Feb. 22, 2008.

Written Opinion of the International Searching Authority for International Application No. PCT/US2007/024651, filed Nov. 29, 2007, date of mailing Feb. 22, 2008.

Office Action for U.S. Appl. No. 11/566,134 dated Mar. 10, 2011.

* cited by examiner

US 7,947,897 B2

ORGANIC PHOTOVOLTAIC CELLS UTILIZING ULTRATHIN SENSITIZING LAYER

UNITED STATES GOVERNMENT RIGHTS

This invention was made with U.S. Government support under Contract No. 339-4012 awarded by U.S. Department of Energy, National Renewable Energy Laboratory. The government has certain rights in this invention.

JOINT RESEARCH AGREEMENT

The claimed invention was made by, on behalf of, and/or in connection with one or more of the following parties to a joint university-corporation research agreement: Princeton University, The University of Southern California, and Global Photonic Energy Corporation. The agreement was in effect on and before the date the claimed invention was made, and the claimed invention was made as a result of activities undertaken within the scope of the agreement.

FIELD OF THE INVENTION

The present invention generally relates to organic photosensitive optoelectronic devices. More specifically, it is directed to organic photosensitive optoelectronic devices including an ultra-thin low mobility active layer that is responsive to near infrared.

BACKGROUND

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into an electrical signal or electricity. Solar cells, also called photovoltaic ("PV") devices, are a type of photosensitive optoelectronic device that is specifically used to generate electrical power. Photoconductor cells are a type of photosensitive optoelectronic device that are used in conjunction with signal detection circuitry which monitors the resistance of the device to detect changes due to absorbed light. Photodetectors, which may receive an applied bias voltage, are a type of photosensitive optoelectronic device that are used in conjunction with current detecting circuits which measures the current generated when the photodetector is exposed to electromagnetic radiation.

These three classes of photosensitive optoelectronic devices may be distinguished according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias.

As used herein, the term "rectifying" denotes, inter alia, that an interface has an asymmetric conduction characteristic, i.e., the interface supports electronic charge transport preferably in one direction. The term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct (i.e., transport) electric charge in a material. The term "photoconductive material" refers to semiconductor materials which are utilized for their property of absorbing electromagnetic radiation to generate electric charge carriers. As used herein, "top" means furthest away from the substrate, while "bottom" means closest to the substrate. There may be intervening layers, unless it is specified that the first layer is "in physical contact with" the second layer.

When electromagnetic radiation of an appropriate energy is incident upon an organic semiconductor material, a photon can be absorbed to produce an excited molecular state. In organic photoconductive materials, the generated molecular state is generally believed to be an "exciton," i.e., an electron-hole pair in a bound state which is transported as a quasi-particle. An exciton can have an appreciable life-time before geminate recombination ("quenching"), which refers to the original electron and hole recombining with each other (as opposed to recombination with holes or electrons from other pairs). To produce a photocurrent, the electron-hole forming the exciton are typically separated at a rectifying junction.

In the case of photosensitive devices, the rectifying junction is referred to as a photovoltaic heterojunction. Types of organic photovoltaic heterojunctions include a donor-acceptor heterojunction formed at an interface of a donor material and an acceptor material, and a Schottky-barrier heterojunction formed at the interface of a photoconductive material and a metal.

FIG. 1 is an energy-level diagram illustrating an example donor-acceptor heterojunction. In the context of organic materials, the terms "donor" and "acceptor" refer to the relative positions of the Highest Occupied Molecular Orbital ("HOMO") and Lowest Unoccupied Molecular Orbital ("LUMO") energy levels of two contacting but different organic materials. If the LUMO energy level of one material in contact with another is lower, then that material is an acceptor. Otherwise it is a donor. It is energetically favorable, in the absence of an external bias, for electrons at a donor-acceptor junction to move into the acceptor material.

As used herein, a first HOMO or LUMO energy level is "greater than" or "higher than" a second HOMO or LUMO energy level if the first energy level is closer to the vacuum energy level 10. A higher HOMO energy level corresponds to an ionization potential ("IP") having a smaller absolute energy relative to a vacuum level. Similarly, a higher LUMO energy level corresponds to an electron affinity ("EA") having a smaller absolute energy relative to vacuum level. On a conventional energy level diagram, with the vacuum level at the top, the LUMO energy level of a material is higher than the HOMO energy level of the same material.

After absorption of a photon 6 in the donor 152 or the acceptor 154 creates an exciton 8, the exciton 8 disassociates at the rectifying interface. The donor 152 transports the hole (open circle) and the acceptor 154 transports the electron (dark circle).

A significant property in organic semiconductors is carrier mobility. Mobility measures the ease with which a charge carrier can move through a conducting material in response to an electric field. In the context of organic photosensitive devices, a material that conducts preferentially by electrons due to a high electron mobility may be referred to as an electron transport material. A material that conducts preferentially by holes due to a high hole mobility may be referred to as a hole transport material. A layer that conducts preferentially by electrons, due to mobility and/or position in the device, may be referred to as an electron transport layer ("ETL"). A layer that conducts preferentially by holes, due to mobility and/or position in the device, may be referred to as a hole transport layer ("HTL"). Preferably, but not necessarily, an acceptor material is an electron transport material and a donor material is a hole transport material.

How to pair two organic photoconductive materials to serve as a donor and an acceptor in a photovoltaic heterojunction based upon carrier mobilities and relative HOMO and LUMO levels is well known in the art, and is not addressed here.

One common feature of bulk semiconductors, as well as insulators, is a "band gap." The band gap is the energy difference between the highest energy level filled with electrons and the lowest energy level that is empty. In an inorganic semiconductor or inorganic insulator, this energy difference is the difference between the valence band edge (top of the valence band) and the conduction band edge (bottom of the conduction band). In an organic semiconductor or organic insulator, this energy difference is the difference between the HOMO and the LUMO. The band gap of a pure material is devoid of energy states where electrons and holes can exist. The only available carriers for conduction are the electrons and holes which have enough energy to be excited across the band gap. In general, semiconductors have a relatively small band gap in comparison to insulators.

In terms of an energy band model for organic semiconductors, only electrons on the LUMO side of the band gap are charge carriers, and only holes on the HOMO side of the band gap are charge carriers.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule." In general, a small molecule has a defined chemical formula with a molecular weight that is the same from molecule to molecule, whereas a polymer has a defined chemical formula with a molecular weight that may vary from molecule to molecule. As used herein, "organic" includes metal complexes of hydrocarbyl and heteroatom-substituted hydrocarbyl ligands.

For additional background explanation and description of the state of the art for organic photosensitive devices, including their general construction, characteristics, materials, and features, U.S. Pat. No. 6,657,378 to Forrest et al., U.S. Pat. No. 6,580,027 to Forrest et al., and U.S. Pat. No. 6,352,777 to Bulovic et al. are incorporated herein by reference.

SUMMARY OF THE INVENTION

A photosensitive device comprises a series of organic photoactive layers disposed between a first electrode and a second electrode. Each layer in the series is in direct contact with a next layer in the series. The series of organic photoactive layers is arranged to form at least one donor-acceptor heterojunction. The series of organic photoactive layers includes a first organic photoactive layer comprising a first host material serving as a donor, a second organic photoactive layer comprising a second host material disposed between the first organic photoactive layer and a third organic photoactive layer, and the third organic photoactive layer comprising a third host material serving as an acceptor. The first host material, the second host material, and the third host material are different. The second organic photoactive layer serves as an acceptor relative to the first organic photoactive layer or as a donor relative to the third photoactive layer. A distance from any point within the second host material of the second organic photoactive layer to a boundary of that layer is not more than one exciton diffusion length over a majority of the area of the second organic photoactive layer. Preferably, the distance from any point within the second host material of the second organic photoactive layer to a boundary of that layer is not more than one exciton diffusion length over an entirety of the area of the second organic photoactive layer.

The second organic photoactive layer may be a unitary layer having openings there through, the first organic photoactive layer being in direct contact with the third organic photoactive layer through said openings, or the second organic photoactive layer may a discontinuous layer having a plurality of islands comprising the second host material, the first organic photoactive layer being in direct contact with the third organic photoactive layer in-between the islands.

The second host material is preferably a small molecule. The first host material and said third host material are also preferably small molecules. The small molecule second host material preferably has an absorption coefficient of at least $5 \times 10^4$ cm$^{-1}$ across a wavelength band from 600 nm to 900 nm.

Each of the first organic photoactive layer, the second organic photoactive layer, and the third organic photoactive layer may have a different absorption spectra.

The second organic photoactive layer may serve as a donor, with the first host material and the second host material having different absorption spectra. Serving as a donor, the HOMO of the second host material is preferably no more than 0.16 eV above a HOMO of the first host material, and the band gap of the second host material is preferably less than a band gap of the first host material. If serving as a donor, the second host material may have a hole mobility of less than $1 \times 10^{-9}$ cm$^2$/Vs and an absorption coefficient of at least $5 \times 10^4$ cm$^{-1}$ across a wavelength band from 600 nm to 900 nm. Examples of the second host material to serve as a donor include tin (II) phthalocyanine (SnPc) and lead phthalocyanine (PbPc). An example of a third host material for the third host material to serve as an acceptor with the SnPc or PbPc donor is $C_{60}$.

The second organic photoactive layer may serve as an acceptor, with the second host material and the third host material having different absorption spectra. Serving as an acceptor, the LUMO of the second host material is preferably no more than 0.16 eV below a LUMO of the third host material. If serving as an acceptor, the band gap of the second host material is preferably less than a band gap of the third host material.

A thickness of the second organic photoconductive layer is preferably not greater than 200 Å, or more preferably, not greater than 100 Å.

The second host material preferably has an absorption coefficient of at least $5 \times 10^4$ cm$^{-1}$ across a wavelength band from 600 nm to 900 nm, and wherein at least a portion of the second organic photoactive layer is disposed at an optical path length of $\lambda_1 \cdot d + \lambda_1/4$ from a reflective surface of the device, where $\lambda_1$ is a wavelength in the wavelength band from 600 nm to 900 nm, d is an integer $\geq 0$, and the reflective surface is reflective to at least 50% of incident light at $\lambda_1$. The reflective surface may be provided for example, by one of the first electrode, the second electrode, and a reflector.

The device may comprise a stack of photoactive cells disposed between the first electrode and the second electrode. In such a stack, the series of organic photoactive layers may be part of a first cell in the stack of photoactive cells. The stack also includes at least a second photoactive cell comprising another donor-acceptor heterojunction. The first cell and the second cell of the stack may have different absorption characteristics. Preferably, an average absorption of the first cell is greater than the average absorption of the second cell over a range of wavelengths $\lambda_1 \pm 5\%$, and an average absorption of the second cell is greater than the average absorption of the first cell over a range of wavelengths $\lambda_2 \pm 5\%$, where $\lambda_1 \geq \lambda_2 + 10\%$.

The series of organic photoactive layers may further comprise a bulk or mixed donor-acceptor layer disposed between the first organic photoactive layer and the third organic photoactive layer. The bulk or mixed donor-acceptor layer includes both the first host material of the first organic photoactive layer and the third host material of the third organic photoactive layer.

The series of organic photoactive layers may further comprise a fourth organic photoactive layer comprising a fourth host material disposed between the first organic photoactive layer and the third organic photoactive layer. The fourth host material is different from the first host material, the second host material, and the third host material. The fourth organic photoactive layer may serve as an acceptor relative to the first organic photoactive layer or as a donor relative to the third photoactive layer. A distance from any point within the fourth organic photoactive layer to a boundary of that layer is not more than one exciton diffusion length.

The figures are not necessarily drawn to scale.

DETAILED DESCRIPTION

Figure 1:
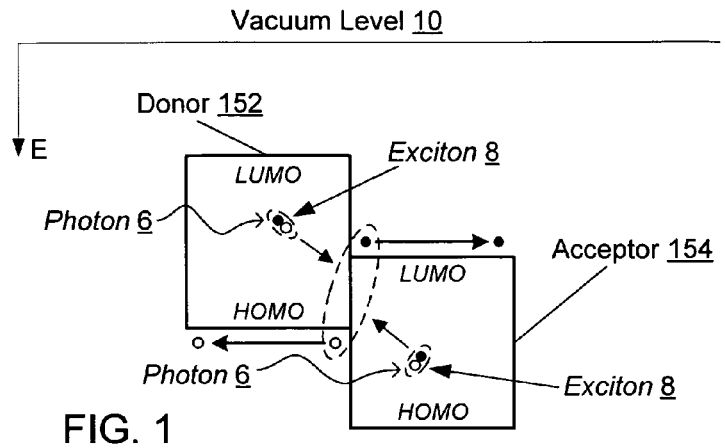
FIG. 1 is an energy level diagram illustrating a donor-acceptor heterojunction.
Figure 2:
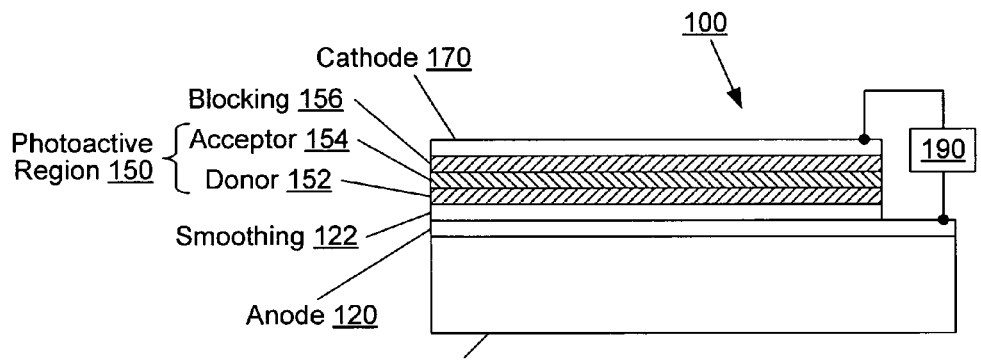
FIG. 2 illustrates an organic photosensitive device including a donor-acceptor heterojunction.

An organic photosensitive device comprises at least one photoactive region in which light is absorbed to form an exciton, which may subsequently dissociate into an electron and a hole. FIG. 2 shows an example of an organic photosensitive optoelectronic device 100 in which the photoactive region 150 comprises a donor-acceptor heterojunction. The "photoactive region" is a portion of a photosensitive device that absorbs electromagnetic radiation to generate excitons that may dissociate in order to generate an electrical current. Device 100 comprises an anode 120, an anode smoothing layer 122, a donor 152, an acceptor 154, an exciton blocking layer ("EBL") 156, and a cathode 170, over a substrate 110.

Examples of EBL 156 are described in U.S. Pat. No. 6,451,415 to Forrest et al., which is incorporated herein by reference for its disclosure related to EBLs. Additional background explanation of EBLs may also be found in Peumans et al., "Efficient photon harvesting at high optical intensities in ultrathin organic double-heterostructure photovoltaic diodes," *Applied Physics Letters* 76, 2650-52 (2000). EBLs reduce quenching by preventing excitons from migrating out of the donor and/or acceptor materials.

The terms "electrode" and "contact" are used interchangeably herein to refer to a layer that provides a medium for delivering photo-generated current to an external circuit or providing a bias current or voltage to the device. As illustrated in FIG. 2, anode 120 and cathode 170 are examples. Electrodes may be composed of metals or "metal substitutes." Herein the term "metal" is used to embrace both materials composed of an elementally pure metal, and also metal alloys which are materials composed of two or more elementally pure metals. The term "metal substitute" refers to a material that is not a metal within the normal definition, but which has the metal-like properties such as conductivity, such as doped wide-bandgap semiconductors, degenerate semiconductors, conducting oxides, and conductive polymers. Electrodes may comprise a single layer or multiple layers (a "compound" electrode), may be transparent, semi-transparent, or opaque. Examples of electrodes and electrode materials include those disclosed in U.S. Pat. No. 6,352,777 to Bulovic et al., and U.S. Pat. No. 6,420,031, to Parthasarathy, et al., each incorporated herein by reference for disclosure of these respective features. As used herein, a layer is said to be "transparent" if it transmits at least 50% of the ambient electromagnetic radiation in a relevant wavelength.

The substrate 110 may be any suitable substrate that provides desired structural properties. The substrate may be flexible or rigid, planar or non-planar. The substrate may be transparent, translucent or opaque. Rigid plastics and glass are examples of preferred rigid substrate materials. Flexible plastics and metal foils are examples of preferred flexible substrate materials.

An anode-smoothing layer 122 may be situated between the anode layer 120 and the donor layer 152. Anode-smoothing layers are described in U.S. Pat. No. 6,657,378 to Forrest et al., incorporated herein by reference for its disclosure related to this feature.

In FIG. 2, the photoactive region 150 comprises the donor material 152 and the acceptor material 154. Organic materials for use in the photoactive region may include organometallic compounds, including cyclometallated organometallic compounds. The term "organometallic" as used herein is as generally understood by one of ordinary skill in the art and as given, for example, in Chapter 13 of "Inorganic Chemistry" (2nd Edition) by Gary L. Miessler and Donald A. Tarr, Prentice Hall (1999).

Organic layers may be fabricated using vacuum deposition, spin coating, organic vapor-phase deposition, inkjet printing and other methods known in the art.

Figure 3:
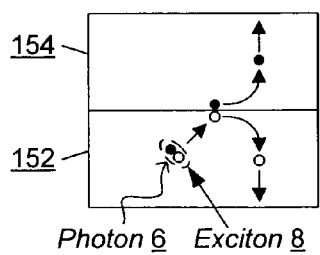
FIG. 3 illustrates a donor-acceptor bilayer forming a planar heterojunction.
Figure 4:
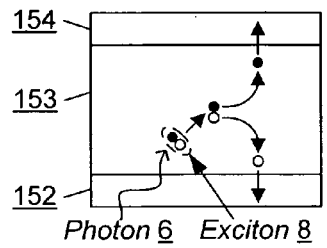
FIG. 4 illustrates a hybrid heterojunction including a mixed heterojunction between a donor layer and an acceptor layer.
Figure 5:
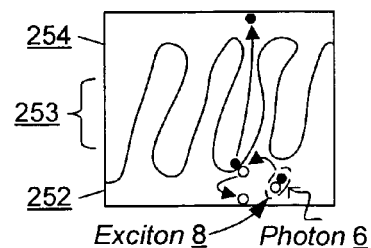
FIG. 5 illustrates a bulk heterojunction.

Examples of various types of donor-acceptor heterojunctions are shown in FIGS. 3-5. FIG. 3 illustrates a donor-acceptor bilayer forming a planar heterojunction. FIG. 4 illustrates a hybrid heterojunction including a mixed heterojunction 153 comprising a mixture of donor and acceptor materials. FIG. 5 illustrates an idealized "bulk" heterojunction. A bulk heterojunction 253, in the ideal photocurrent case, has a single continuous interface between the donor material 252 and the acceptor material 254, although multiple interfaces typically exist in actual devices. Mixed and bulk heterojunctions can have multiple donor-acceptor interfaces as a result of having plural domains of material. Domains that are surrounded by the opposite-type material (e.g., a domain of donor material surrounded by acceptor material) may be electrically isolated, such that these domains do not contribute to photocurrent. Other domains may be connected by percolation pathways (continuous photocurrent pathways), such that these other domains may contribute to photocurrent. The distinction between a mixed and a bulk heterojunction lies in degrees of phase separation between donor and acceptor materials. In a mixed heterojunction, there is very little or no phase separation (the domains are very small, e.g., less than a few nanometers), whereas in a bulk heterojunction, there is significant phase separation (e.g., forming domains with sizes of a few nanometers to 100 nm).

Small-molecule mixed heterojunctions may be formed, for example, by co-deposition of the donor and acceptor materials using vacuum deposition or vapor deposition. Small-molecule bulk heterojunctions may be formed, for example, by controlled growth, co-deposition with post-deposition annealing, or solution processing. Polymer mixed or bulk heterojunctions may be formed, for example, by solution processing of polymer blends of donor and acceptor materials.

If a photoactive region includes a mixed layer (153) or bulk layers (252, 254) and one or both of the donor (152) and acceptor layers (154), the photoactive region is said to include a "hybrid" heterojunction. The arrangement of layers in FIG. 4 is an example. For additional explanation of hybrid heterojunctions, U.S. Published Patent Application 2005-0224113 A1 entitled "High efficiency organic photovoltaic cells employing hybridized mixed-planar heterojunctions" by Jiangeng Xue et al., published Oct. 13, 2005, is hereby incorporated by reference.

In general, planar heterojunctions have good carrier conduction, but poor exciton dissociation; a mixed layer has poor carrier conduction and good exciton dissociation, and a bulk heterojunction has good carrier conduction and good exciton dissociation, but may experience charge build-up at the end of the material "cul-de-sacs," lowering efficiency. Unless otherwise stated, planar, mixed, bulk, and hybrid heterojunctions may be used interchangeably as donor-acceptor heterojunctions throughout the embodiments disclosed herein.

Figure 6:
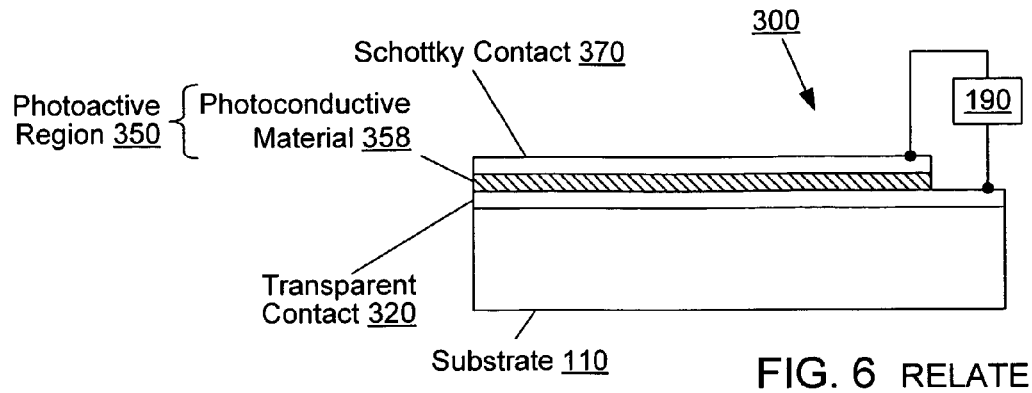
FIG. 6 illustrates an organic photosensitive device including a Schottky-barrier heterojunction.

FIG. 6 shows an example of a organic photosensitive optoelectronic device 300 in which the photoactive region 350 is part of a Schottky-barrier heterojunction. Device 300 comprises a transparent contact 320, a photoactive region 350 comprising an organic photoconductive material 358, and a Schottky contact 370. The Schottky contact 370 is typically formed as a metal layer. If the photoconductive layer 358 is an ETL, a high work function metal such as gold may be used, whereas if the photoconductive layer is an HTL, a low work function metal such as aluminum, magnesium, or indium may be used. In a Schottky-barrier cell, a built-in electric field associated with the Schottky barrier pulls the electron and hole in an exciton apart. Generally, this field-assisted exciton dissociation is not as efficient as the disassociation at a donor-acceptor interface.

The devices as illustrated may be connected to an element 190. If the device is a photovoltaic device, element 190 is a resistive load which consumes or stores power. If the device is a photodetector, element 190 is a current detecting circuit which measures the current generated when the photodetector is exposed to light, and which may apply a bias to the device (as described for example in Published U.S. Patent Application 2005-0110007 A1, published May 26, 2005 to Forrest et al.). If the rectifying junction is eliminated from the device (e.g., using a single photoconductive material as the photoactive region), the resulting structures may be used as a photoconductor cell, in which case the element 190 is a signal detection circuit to monitor changes in resistance across the device due to the absorption of light. Unless otherwise stated, each of these arrangements and modifications may be used for the devices in each of the drawings and embodiments disclosed herein.

An organic photosensitive optoelectronic device may also comprise transparent charge transfer layers, electrodes, or charge recombination zones. A charge transfer layer may be organic or inorganic, and may or may not be photoconductively active. A charge transfer layer is similar to an electrode, but does not have an electrical connection external to the device and delivers charge carriers from one subsection of an optoelectronic device to the adjacent subsection. A charge recombination zone is similar to a charge transfer layer, but allows for the recombination of electrons and holes between adjacent subsections of an optoelectronic device. A charge recombination zone may include semi-transparent metal or metal substitute recombination centers comprising nanoclusters, nanoparticles, and/or nanorods, as described for example in U.S. Pat. No. 6,657,378 to Forrest et al.; U.S. patent application Ser. No. 10/915,410 entitled "Organic Photosensitive Devices" by Rand et al., filed Aug. 11, 2004; and U.S. patent application Ser. No. 10/979,145 entitled "Stacked Organic Photosensitive Devices" by Forrest et al., filed Nov. 3, 2004; each incorporated herein by reference for its disclosure of recombination zone materials and structures. A charge recombination zone may or may not include a transparent matrix layer in which the recombination centers are embedded. A charge transfer layer, electrode, or charge recombination zone may serve as a cathode and/or an anode of subsections of the optoelectronic device. An electrode or charge transfer layer may serve as a Schottky contact.

Figure 7:
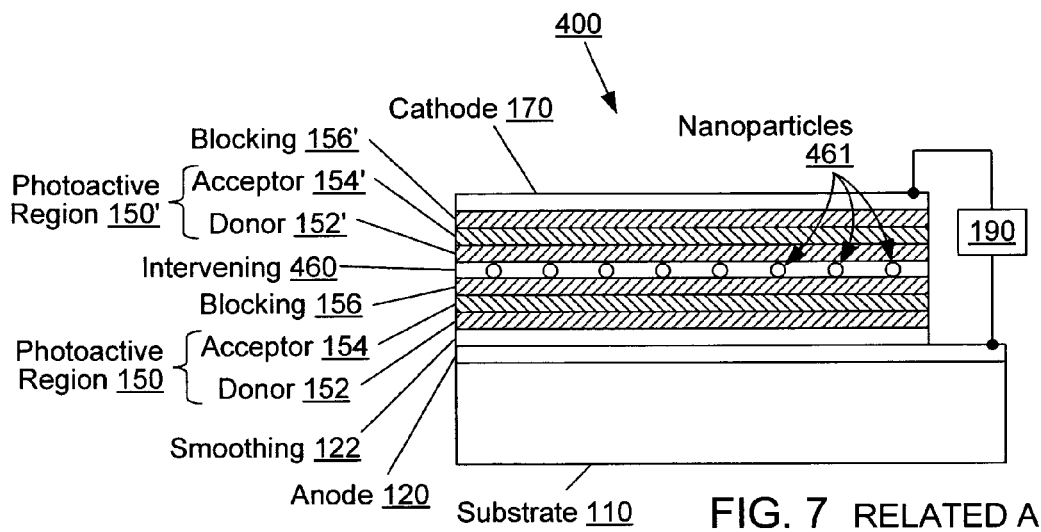
FIG. 7 illustrates tandem photosensitive cells in series.
Figure 8:
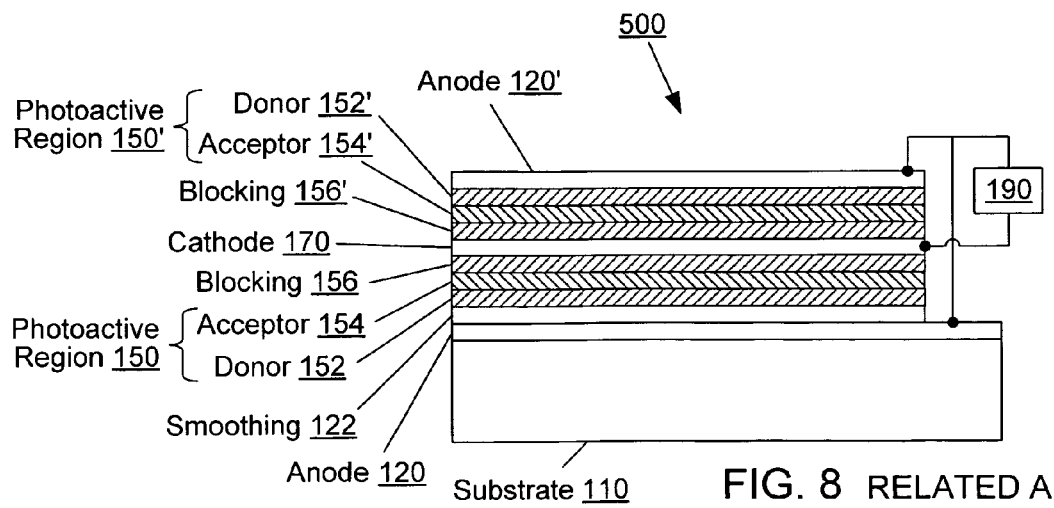
FIG. 8 illustrates tandem photosensitive cells in parallel.

FIGS. 7 and 8 illustrate examples of tandem devices including such transparent charge transfer layers, electrodes, and charge recombination zones. In device 400 in FIG. 7, photoactive regions 150 and 150' are stacked electrically in series with an intervening conductive region 460. As illustrated without external electrical connections, intervening conductive region 460 may be a charge recombination zone or may be a charge transfer layer. As a recombination zone, region 460 comprises recombination centers 461 with or without a transparent matrix layer. If there is no matrix layer, the arrangement of material forming the zone may not be continuous across the region 460. Device 500 in FIG. 8 illustrates photoactive regions 150 and 150' stacked electrically in parallel, with the top cell being in an inverted configuration (i.e., cathode-down). In each of FIGS. 7 and 8, the photoactive regions 150 and 150' and blocking layers 156 and 156' may be formed out of the same respective materials, or different materials, depending upon the application. Likewise, photoactive regions 150 and 150' may be a same type (i.e., planar, mixed, bulk, hybrid) of heterojunction, or may be of different types.

In each of the devices described above, layers may be omitted, such as the exciton blocking layers. Other layers may be added, such as reflective layers or additional photoactive regions. The order of layers may be altered or inverted. A concentrator or trapping configuration may be employed to increase efficiency, as disclosed, for example in U.S. Pat. No. 6,333,458 to Forrest et al. and U.S. Pat. No. 6,440,769 to Peumans et al., which are incorporated herein by reference. Coatings may be used to focus optical energy into desired regions of a device, as disclosed, for example in U.S. patent application Ser. No. 10/857,747 entitled "Aperiodic dielectric multilayer stack" by Peumans et al., filed Jun. 1, 2004, which is incorporated herein by reference. In the tandem devices, transparent insulative layers may be formed between cells, with the electrical connection between the cells being provided via electrodes. Also in the tandem devices, one or more of the photoactive regions may be a Schottky-barrier heterojunction instead of a donor-acceptor heterojunction. Arrangements other than those specifically described may be used.

Photovoltaic devices produce a photo-generated current when they are connected across a load and are irradiated by light. When irradiated under infinite load, a photovoltaic device generates its maximum possible voltage, V open-circuit, or $V_{OC}$. When irradiated with its electrical contacts shorted, a photovoltaic device generates its maximum possible current, I short-circuit, or $I_{SC}$. When actually used to generate power, a photovoltaic device is connected to a finite resistive load and the power output is given by the product of the current and voltage, I×V. The maximum total power generated by a photovoltaic device is inherently incapable of exceeding the product, $I_{SC} \times V_{OC}$. When the load value is optimized for maximum power extraction, the current and voltage have the values, $I_{max}$ and $V_{max}$, respectively.

A figure of merit for photovoltaic devices is the fill factor, ff, defined as:

$$ff=\{I_{max}V_{max}\}/\{I_{SC}V_{OC}\}$$

where ff is always less than 1, as $I_{SC}$ and $V_{OC}$ are never obtained simultaneously in actual use. Nonetheless, as ff approaches 1, the device has less series or internal resistance and thus delivers a greater percentage of the product of $I_{SC}$ and $V_{OC}$ to the load under optimal conditions. Where $P_{inc}$ is the power incident on a device, the power efficiency of the device, p, may be calculated by:

$$p = ff*(I_{SC}*V_{OC})/P_{inc}$$

Organic photovoltaic cells have many potential advantages when compared to traditional silicon-based devices. Organic photovoltaic cells are light weight, economical in materials use, and can be deposited on low cost substrates, such as flexible plastic foils. However, some organic photovoltaic devices typically have relatively low external quantum efficiency, being on the order of 1% or less. This is, in part, thought to be due to the second order nature of the intrinsic photoconductive process. That is, carrier generation requires exciton generation, diffusion and ionization or collection. There is an efficiency associated with each of these processes. Subscripts may be used as follows: P for power efficiency, EQE for external quantum efficiency, A for photon absorption, ED for exciton diffusion, CC for charge collection, and INT for internal quantum efficiency. Using this notation:

$$\eta_P \sim \eta_{EQE} = \eta_A * \eta_{ED} * \eta_{CC}$$

$$\eta_{EQE} = \eta_A * \eta_{INT}$$

Photodetectors and photovoltaic (PV) cells using small molecular weight organic thin films deposited on plastic substrates have the potential advantages of being low-cost and lightweight. See S. R. Forrest, "The path to ubiquitous and low-cost organic electronic appliances on plastic," Nature 428, 911-918 (2004). Recently, the power conversion efficiency of molecular organic PV cells has steadily improved due to the use of new materials and device architectures. See S. R. Forrest, "The Limits to Organic Photovoltaic Cell Efficiency," MRS Bulletin 30, 28-32 (2005); and J. Xue et al., "Asymmetric tandem organic photovoltaic cells with hybrid planar-mixed molecular heterojunctions," Applied Physics Letters 85, 5757-5759 (2004).

One problem with organic PV energy conversion, however, is the limited overlap between the active layer absorption with the solar spectrum. Indeed, over 60% of the total solar photon flux is at wavelengths $\lambda > 600$ nm with approximately 50% in the red and near infrared (NIR) spectrum at $600 < \lambda < 1000$ nm. Therefore, new materials need to be developed that can absorb NIR radiation, and efficiently convert absorbed photons into current.

Recently, a polymer-based solar cell sensitive to NIR radiation up to $\lambda = 1000$ nm achieved a power conversion efficiency of 0.3% under 1 sun illumination. See X. J. Wang et al., Applied Physics Letters 85, 5081 (2004). However, previous efforts with small molecule materials have failed to extend device responsivity into NIR.

Research into developing a small molecule photosensitive device has yielded a new architecture which, in addition to achieving NIR responsivity, may be used to tune and/or broaden the sensitivity of any donor-acceptor heterojunction. By incorporating a thin sensitizing layer between donor and acceptor, this new architecture enables the construction of photosensitive devices which retain their overall device thickness, but which can produce photocurrent in a part of the spectrum otherwise inaccessible using other materials.

In addition, a larger array of different materials are available for use as the thin sensitizing layer than would otherwise be viable as either a conventional donor or acceptor layer. For example, a material having low charge carrier mobility can be employed without a loss of device performance. By pairing the thin sensitizing layer with an energetically favorable donor or acceptor layer, the thin sensitizing layer contributes to photocurrent, without impeding carrier transport between the donor and acceptor.

Figure 9:
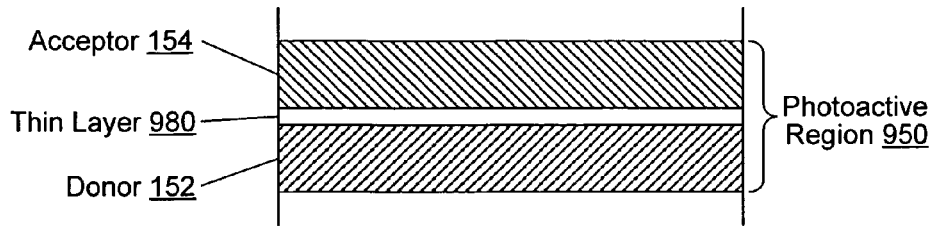
FIG. 9 illustrates a planar heterojunction modified to include an additional thin photoactive layer.

FIG. 9 illustrates a donor-acceptor, heterojunction, as used in the devices (e.g., 100, 400, 500) discussed above, modified to incorporate the new thin sensitizing layer 980 within a photoactive region 950. The thin sensitizing layer 980 comprises a host material that is different from either that of the donor 152 or the acceptor 154. A "host material" of an organic photoactive layer, as defined herein, is a photoactive organic molecule making up more than 50% molar of the respective layer. The thin sensitizing layer 980 may be configured as a donor or as an acceptor. In any case, a distance from any point within the host material of the sensitizing layer 980 to a boundary of that layer is not more than one exciton diffusion length over a majority (>50%) of the area of the thin sensitizing layer 980. An exciton diffusion length is the travel distance over which 1/e excitons decay/recombine. The distance is over a "majority" of the area since the layer 980 may include edge effects and small variations in local thickness (e.g., bumps and beads). Preferably, edge effects and the like are avoided, and the distance from any point within the host material of the thin sensitizing layer 980 to a boundary of that layer is not more than one exciton diffusion length over an entirety of the area of the thin sensitizing layer 980. Preferably, even if twice this distance across the sensitizing layer 980 is more than 200 Å, the layer thickness is no greater than 200 Å. More preferably, the layer thickness is no greater than 100 Å.

Due to efficiency concerns, a balance may be struck between the thinness and the photocurrent contribution of the sensitizing layer 980. Favoring a thin layer is the desire to minimize resistivity across the photoactive layer for carriers transiting between donor layer 152 and acceptor layer 154, and maximizing the ability of excitons formed in the sensitizing layer 980 to reach a rectifying interface. Favoring a thick layer is the volume in which photons can be absorbed in the absorption wavelength band of the sensitizing layer 980. While two exciton diffusion lengths is an idealized thickness upper limit, it is expected that for most material combinations and light-source spectra, a thinner sensitizing layer 980 is desirable.

Figure 10A:
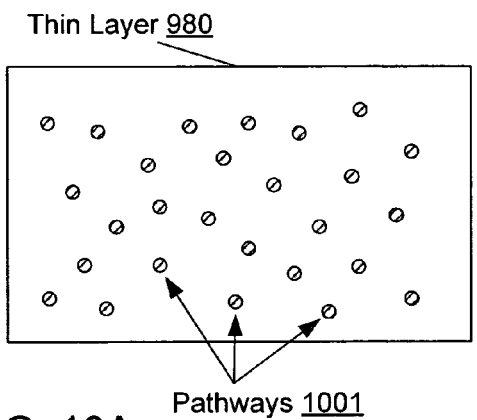
FIG. 10A illustrates a cross-section of an example of the thin photoactive layer.

While the thin sensitizing layer 980 may be solid, it may instead be porous, as illustrated in FIG. 10A. If porous, the sensitizing layer 980 includes a plurality of pathways 1001 (i.e., openings) through a unitary layer. The adjacent layers (e.g., the donor 152 and the acceptor 154) directly contact each other through the pathways 1001, providing charge carriers a direct path between layers. The pathways 1001 can manifest during the deposition process due to, for example, using such a thin layer 980 that there is a natural irregularity to coverage (e.g., growth until material nucleation sites connect, but before all gaps are filled), or by having surface irregularity in the underlying layer (e.g., donor 152) that results in irregular coverage.

Figure 10B:
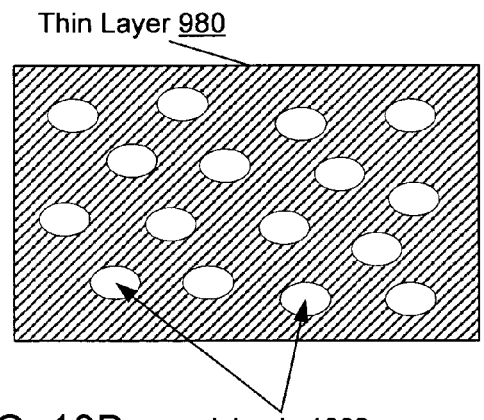
FIG. 10B illustrates a cross-section of another example of the thin protective layer.

FIG. 10B is another example of thin layer 980. In this example, the layer comprises a plurality of discontinuous islands of material. The islands 1002 can manifest during the deposition process due to, for example, stopping growth shortly after nucleation.

A solid layer, a discontinuous layer of islands, or a porous unitary layer may be selected during fabrication simply by controlling how long growth is allowed to continue after material nucleation. While all three styles of layer 980 are operable, the porous unitary layer is preferred for its balance of photoactive surface area while providing direct charge-carrier transit between adjacent layers (e.g., the donor 152 and the acceptor 154) via pathways 1001.

Preferably, the thin sensitizing layer 980 is a small molecule material. Likewise, it is preferred at the donor layer 152 and acceptor layer 154 also be small molecule materials. To absorb NIR, the second material may have an absorption coefficient of at least $5 \times 10^4$ cm$^{-1}$ across a wavelength band from 600 nm to 900 nm. To maximize coverage of the absorption spectra, the three photoactive layers (152, 980, 154) may each have a different absorption spectra.

Figure 11:
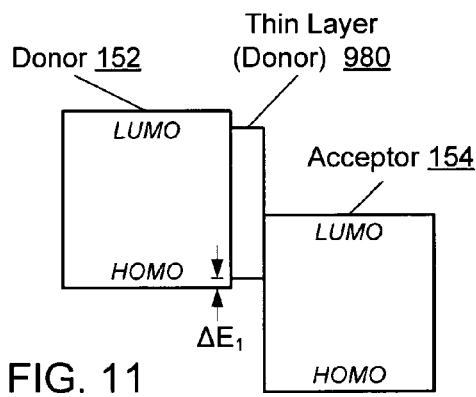
FIG. 11 illustrates an energy level diagram including the thin photoactive layer as a donor.

Referring to FIG. 11, the thin sensitizing layer 980 may serve as a donor, having a different host material than donor layer 152. Preferably, the HOMO of the thin sensitizing layer 980 is no more than 5 kT above the HOMO of the donor layer 152 (k being the Boltzmann constant and T being the operating temperature), thereby avoiding the trapping of holes at the donor layer (152)-sensitizing layer (980) interface. This difference in HOMO levels is illustrated as $\Delta E_1$ in FIG. 11.

Operating temperatures for organic photosensitive devices are commonly specified as having a range of T=−40° C. to +100° C. Thus, using +100° C. as a maximum limit and solving for 5 kT (i.e., $5 \times 1.3806505E-23$(J/K)/$1.602E-19$(J/eV)$\times$(T° C.+273.15)° K.), the HOMO of the thin sensitizing layer 980 should be no more than 0.16 eV above the HOMO of the donor layer 152.

If arranging the sensitizing layer 980 as a donor, the band gap of the material forming the sensitizing layer 980 may be less than the band gap of the material forming the donor layer 152. Since absorption sensitivity is, in general, inversely proportional to the band gap of a pure material, arranging the band gaps in this manner enables absorption of longer-wavelength photons than would occur with the donor layer 152 alone.

By keeping the sensitizing layer 980 thin, a whole class of materials that would otherwise not be viable with any reasonable efficiency in a photoactive device may be used. For example, if using sensitizing layer 980 as a donor, a host material of the sensitizing layer 980 may have a hole mobility of less than $1 \times 10^{-9}$ cm$^2$/Vs. Classically, using such a material as a donor is counterintuitive, since high hole mobility is a characteristic sought for donors to maximize the external quantum efficiency of the device. However, there are many low hole-mobility materials, such as tin(II) phthalocyanine (SnPc) and lead phthalocyanine (PbPc) with poor hole mobilities, but with absorption coefficients of at least $5 \times 10^4$ cm$^{-1}$ across a wavelength band from 600 nm to 900 nm.

Thus, materials with highly desirable absorption properties but poor mobility properties may be used in the sensitizing layer 980, even though such materials may not have previously been usable due to their poor mobility properties.

Figure 12:
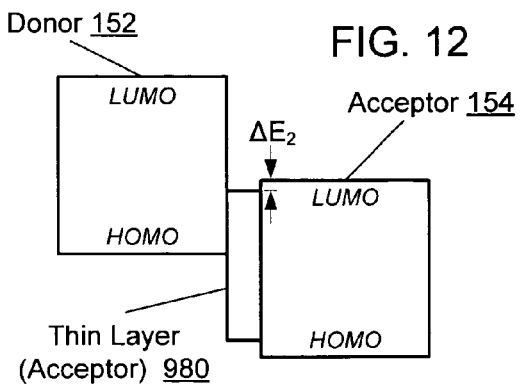
FIG. 12 illustrates an energy level diagram including the thin photoactive layer as an acceptor.

Referring to FIG. 12, the thin sensitizing layer 980 may serve as an acceptor, having a different host material than acceptor layer 154. Preferably, the LUMO of the thin sensitizing layer 980 is no more than 5 kT below the LUMO of the acceptor layer 154, thereby avoiding the trapping of electrons at the acceptor layer (154)-sensitizing layer (980) interface. This difference in LUMO levels is illustrated as $\Delta E_2$ in FIG. 12.

If arranging the sensitizing layer 980 as an acceptor, the band gap of the material forming the sensitizing layer 980 may be less than the band gap of the material forming the acceptor layer 154. Since absorption sensitivity is, in general, inversely proportional to the band gap of a pure material, arranging the band gaps in this manner enables absorption of longer-wavelength photons than would occur with the acceptor layer 154 alone.

By keeping the sensitizing layer 980 thin, a host material having an electron mobility of less than $1 \times 10^{-9}$ cm$^2$/V may used. Classically, using such a material as an acceptor is counterintuitive, since high electron mobility is a characteristic sought for acceptors to maximize the external quantum efficiency of the device. Thus, materials with highly desirable absorption properties but poor mobility properties may be used in the sensitizing layer 980, even though such materials may not have previously been usable due to their poor mobility properties.

Figure 13:
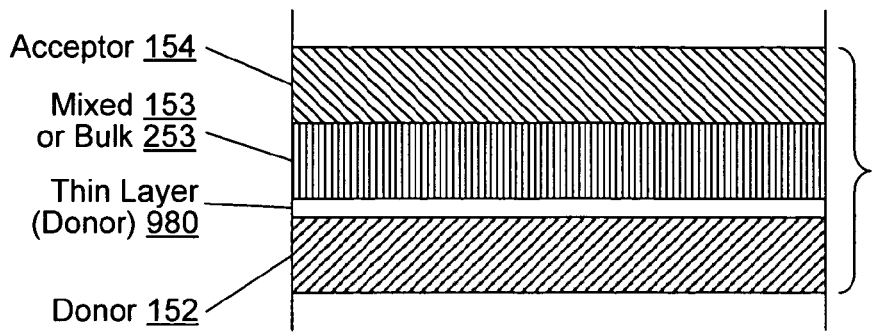
FIG. 13 illustrates a hybrid heterojunction including the thin photoactive layer as a donor.
Figure 14:
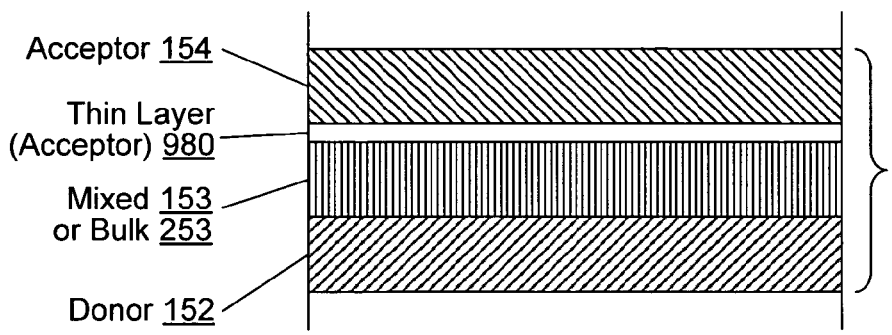
FIG. 14 illustrates a hybrid heterojunction including the thin photoactive layer as an acceptor.

The sensitizing layer 980 may also be used in a hybrid heterojunction, as illustrated in FIGS. 13 and 14. In FIG. 13, sensitizing layer 980 serves as a donor within photoactive region 1350. Preferably, as a donor, the HOMO of the thin sensitizing layer 980 is no more than 5 kT above the HOMO of the donor layer 152 ($\Delta E_1$). In FIG. 14, sensitizing layer 980 serves as a acceptor within photoactive region 1450. Preferably, as an acceptor, the LUMO of the thin sensitizing layer 980 is no more than 5 kT below the LUMO of the acceptor layer 154 ($\Delta E_2$).

Figure 15:
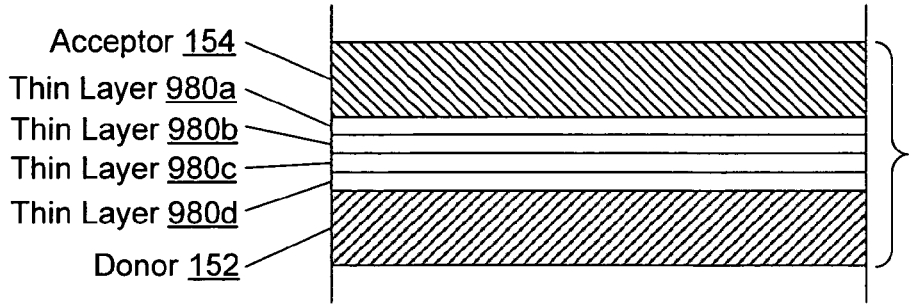
FIG. 15 illustrates a planar heterojunction including a plurality of thin photoactive layers.
Figure 16:
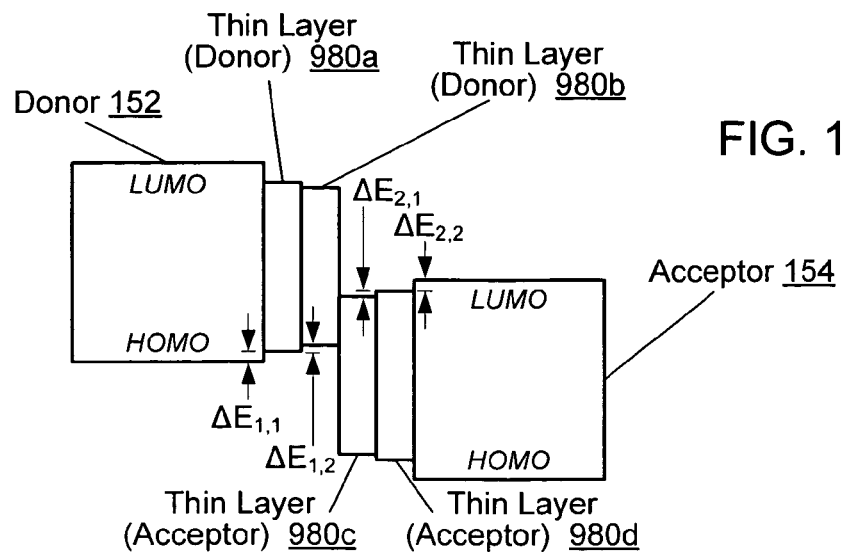
FIG. 16 illustrates an energy level diagram including the plurality of thin photoactive layers for the planar heterojunction in FIG. 15.

FIG. 15 illustrates a photoactive region 1550 including a plurality of donor sensitizing layers (980a, 980b) and a plurality of acceptor sensitizing layers (980c, 980d). FIG. 16 is an energy level diagram for a photosensitive cell comprising the plurality of thin sensitizing layers 980a-d within the single photoactive region in FIG. 15. Preferably, to avoid charge carrier trapping: the HOMO of the first thin sensitizing donor layer 980a is no more than 5 kT above the HOMO of the donor layer 152 ($\Delta E_1$); the HOMO of the second thin sensitizing donor layer 980b is no more than 5 kT above the HOMO of the first thin sensitizing donor layer 980a ($\Delta E_{1,2}$); the LUMO of the first thin sensitizing acceptor layer 980c is no more than 5 kT below the LUMO of the second thin sensitizing acceptor layer 980d ($\Delta E_{2,1}$); and the LUMO of the second thin sensitizing acceptor layer 980d is no more than 5 kT below the LUMO of the acceptor layer 154 ($\Delta E_{2,2}$).

The photoactive regions (950, 1350, 1450, 1550) having the one or more sensitizing layers 980 are interchangeable with photoactive regions 150 and/or 150' in the photosensitive devices discussed above, including devices 100, 400, and 500.

Figure 17:
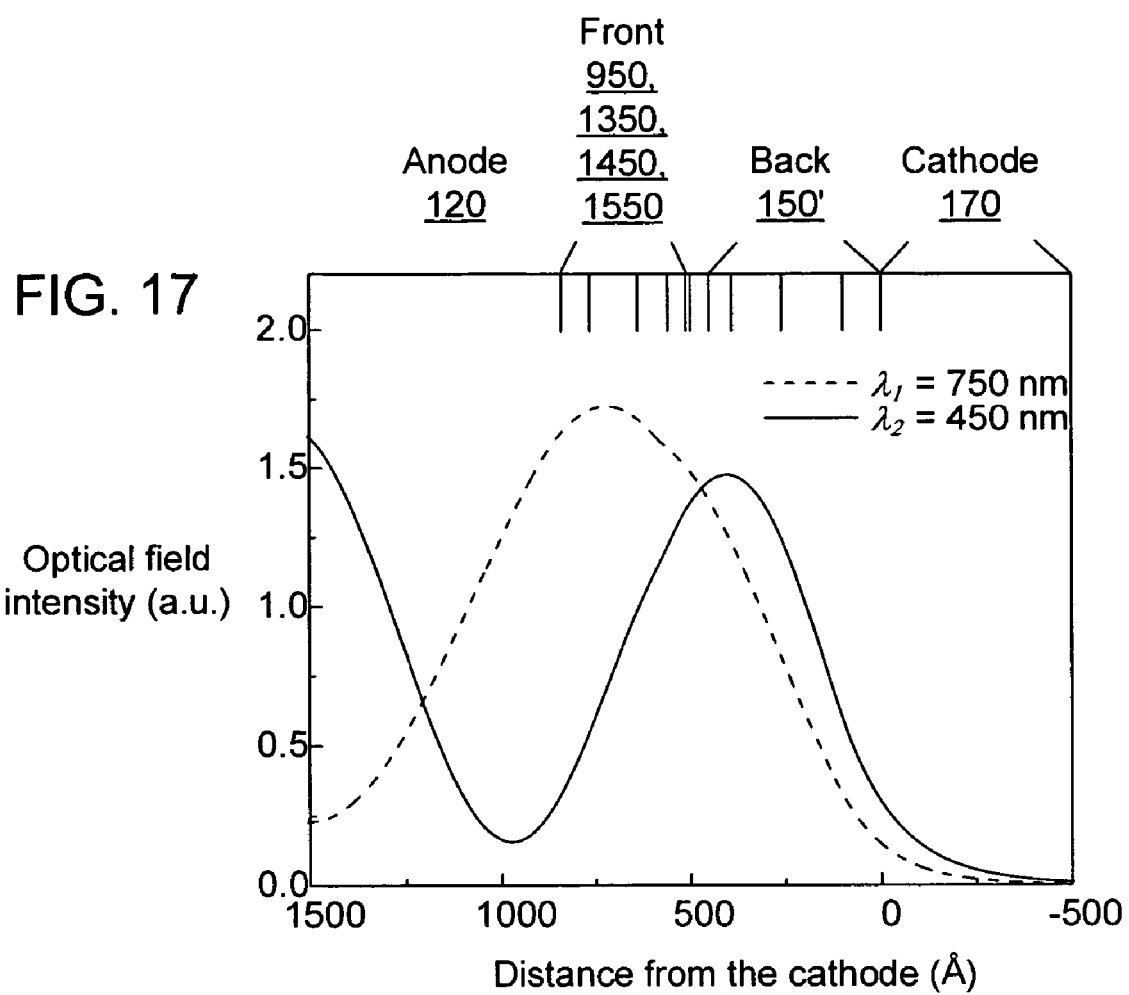
FIG. 17 illustrates the positioning of the various layers to maximize absorption by the thin photoactive layer.

As illustrated in FIG. 17, device performance is improved by positioning at least a portion of the thin sensitizing layer 980 (as illustrated, arranged as a layer within a photoactive region 950/1350/1450/1550 in the tandem device shown in FIG. 7) at an optical path length of $\lambda_1 \cdot +\lambda_1/4$ (d is an integer $\geq 0$) from a reflective surface of the device. If, for example, the sensitizing layer 980 has an absorption coefficient of at least $5 \times 10^4$ cm$^{-1}$ across a wavelength band from 600 nm to 900 nm, then $\lambda_1$ is a wavelength in the wavelength band from 600 nm to 900 nm. By positioning a peak in this band (750 nm, as illustrated) to overlap a portion of the sensitizing layer better assures that light in the desired bandwidth will be absorbed.

The reflective surface preferably reflects at least 50% of incident light at $\lambda_1$. The reflective surface can be a separate layer, or may be provided by one of the electrodes (e.g., cathode 170 in FIG. 2 and FIG. 7; anode 170' in FIG. 8).

If the sensitizing layer 980 is in a photoactive region of a first cell within a stack of cells, overall performance can be improved by configuring the different cells to have different absorption characteristics. Preferably, the average absorption of the first cell (having the sensitizing layer 980), is greater than the average absorption of the second cell over a range of wavelengths $\lambda_1 \pm 5\%$, and an average absorption of the second cell is greater than the average absorption of the first cell over a range of wavelengths $\lambda_2 5\%$; where $\lambda_1 \geq \lambda_2 + 10\%$, $\lambda_1$ is a wavelength in the absorption band from 600 nm to 900 nm, and the host material serving as the sensitizing layer 980 has an absorption coefficient of at least $5 \times 10^4$ cm$^{-1}$ across 600 nm to 900 nm.

Since what materials constitute a donor and what materials constitute an acceptor depend up relative energy levels between layers, a same material (e.g., SnPc, PbPc) may serve as a donor layer with one set of materials as donor 152/252 and acceptor 154/254, and serve as an acceptor layer with a different set of materials as donor 152/252 and acceptor 154/254.

EXAMPLES

Experiments were performed on an organic photovoltaic cell based on a tin(II) phthalocyanine (SnPc)/C$_{60}$ donor/acceptor heterojunction with sensitivity at wavelengths of $\lambda$>900 nm. The low hole mobility in polycrystalline thin films of SnPc, $\mu_h=(2\pm1)\times 10^{-10}$ cm$^2$/Vs, prevents the use of thick layers, leading to low fill factors and low power conversion efficiencies. However, owing to its large absorption coefficient, a 50-Å-thick layer of SnPc yields external solar cell external quantum efficiencies of up to 21% at $\lambda$=750 nm. With the double heterostructure of indium-tin-oxide/100 Å copper phthalocyanine/50 Å SnPc/540 Å C$_{60}$/75 Å bathocuproine/Ag, we obtain a power conversion efficiency of $(1.0\pm0.1)$% under 1 sun standard AM1.5G solar illumination and efficiencies of $(1.3\pm0.1)$% under intense (10 suns) standard AM1.5G solar illumination. For an example of a device without the SnPc sensitizing layer (an indium-tin-oxide/copper phthalocyanine/C$_{60}$/Ag device), see "4.2% efficient organic photovoltaic cells with low series resistances," by J. Xue et al., Applied Physics Letters 84, 3013-3015 (2004).

The photogeneration process in organic materials starts with the absorption of a photon that creates an exciton, or bound electron-hole pair. In efficient organic photovoltaic devices, the exciton is then dissociated at a donor-acceptor interface into free charge carriers, which are subsequently collected at their respective electrodes. Using a tin(II) phthalocyanine (SnPc) layer as the electron donor in double heterostructure organic solar cells, the SnPc layer efficiently converts incident NIR light to photocurrent. Power conversion efficiencies of $\eta_P=(1.0\pm0.1)$% under 1 sun standard AM1.5G (air mass 1.5 global) solar illumination are possible. The high efficiency results since the fill factor is FF=0.5 for ultrathin SnPc layers, whereas previously demonstrated devices (X. J. Wang et al., Applied Physics Letters 85, 5081 (2004)) had FF=0.32. This high FF is achieved through control of SnPc layer thickness such that its low hole mobility does not negatively impact device performance.

All devices were fabricated on 1500-Å-thick layers of indium tin oxide (ITO) commercially precoated onto glass substrates with a sheet resistance of 15 Ω/sq. The solvent-cleaned (see J. Xue et al., Journal Applied Physics 95, 1869 (2004)) ITO surface was treated in ultraviolet/O$_3$ for 5 min immediately before loading the substrates into a high vacuum chamber (base pressure $\sim 3\times 10^{-7}$ Torr), where organic layers and a 1000-Å-thick Ag cathode were deposited via thermal evaporation. Prior to deposition, the organic materials were purified in three cycles using vacuum thermal gradient sublimation. (See R. A. Laudise et al., Journal of Crystal Growth 187, 449 (1998)).

The Ag cathode was evaporated through a shadow mask with 1 mm diameter openings to define the device area. The current density vs. voltage (J-V) characteristics were measured in the dark and under simulated AM1.5G solar illumination (Oriel Instruments) using an HP4155B semiconductor parameter analyzer. Illumination intensity and quantum efficiency measurements were conducted using standard methods employing a National Renewable Energy Laboratory traceable calibrated Si detector (ASTM Standards E1021, E948, E973 American Society for Testing and Materials, West Conshohocken Pa.).

Differences between the simulated and actual (i.e. standard) solar spectra were corrected in our final efficiency determination. Absorption spectra were measured on quartz substrates using a PerkinElmer Lambda 800 UV/Vis spectrometer referenced to clean quartz substrates to cancel out absorption losses in the quartz. The SnPc hole conductivity was measured for devices consisting of a 1000-Å-thick layer sandwiched between ITO and Au contacts.

Figure 18:
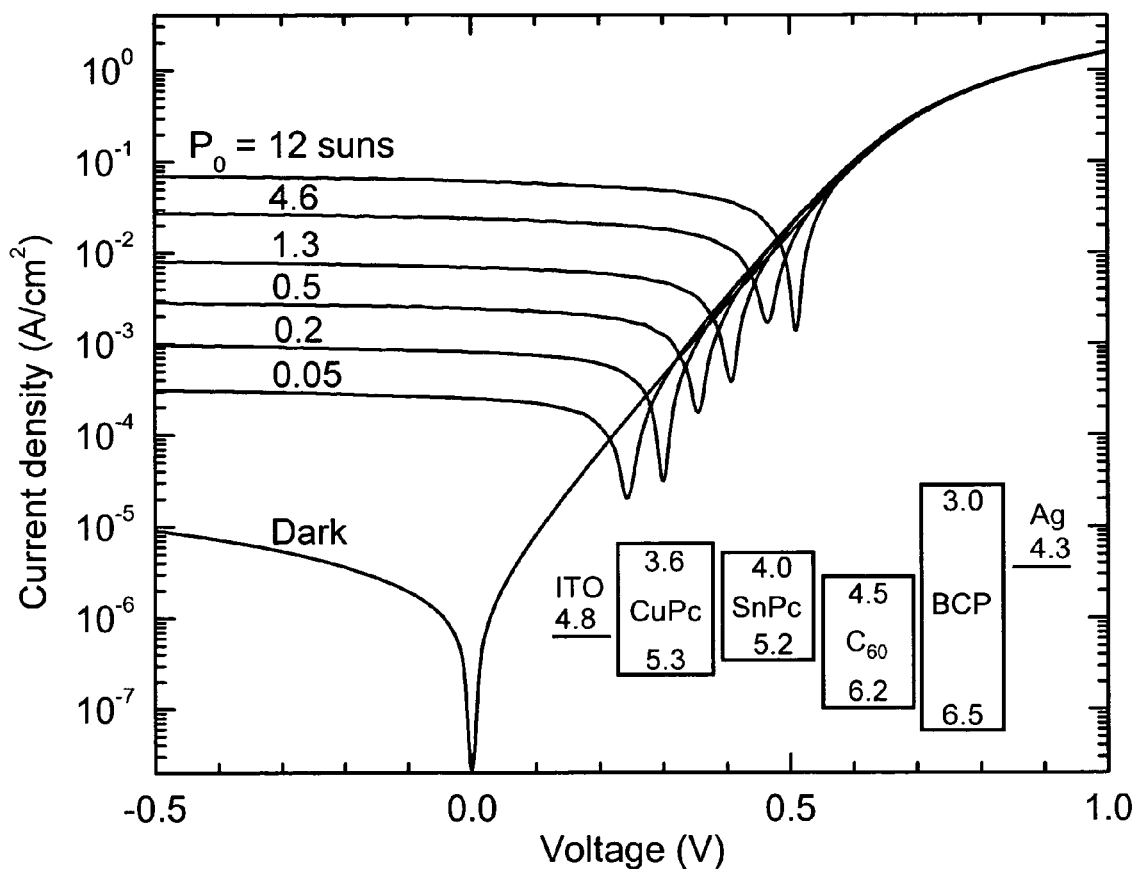
FIG. 18 illustrates current density as function of voltage, in the dark and under various illumination intensities, of an example photosensitive cell including the thin photoactive layer.

FIG. 18 illustrates the J-V characteristics of a device with the structure ITO/CuPc(100 Å)/SnPc(50 Å)/$C_{60}$(540 Å)/BCP (75 Å)/Ag (here CuPc denotes copper phthalocyanine, and BCP is bathocuproine) in the dark and under various illumination intensities ($P_0$) of AM1.5G standard solar illumination. The donor-acceptor heterojunction is defined at the SnPc/$C_{60}$ interface and BCP serves as an exciton blocking layer. Fitting the dark current to classical p-n junction diode theory (see J. Xue et al., Applied Physics Letters 84, 3013-3015 (2004)) yields a series resistance of $R_S$=0.17 Ωcm² and an ideality factor of n=1.96±0.05. An energy level scheme is shown in the inset to FIG. 18, where the highest occupied molecular orbital energy levels are measured by ultraviolet photoelectron spectroscopy. The lowest unoccupied molecular orbital energies are estimated using the optical energy gap of each material.

Figure 20:
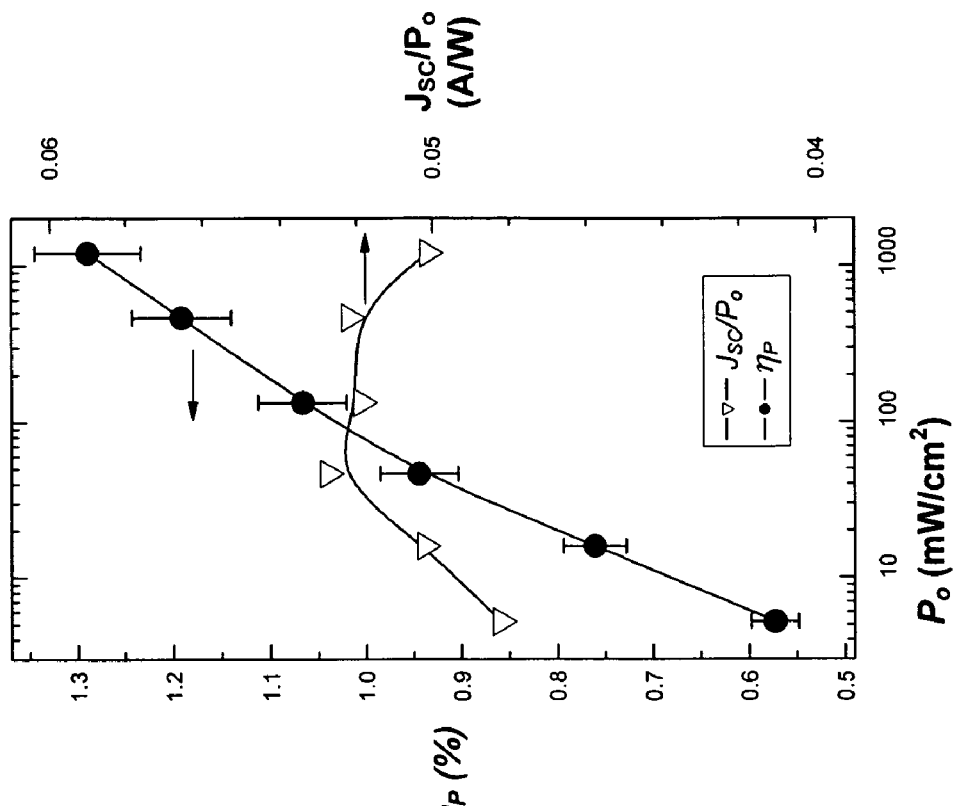
FIG. 20 illustrates power conversion efficiency as a function of illumination intensity for the same device as FIG. 14.
Figure 19:
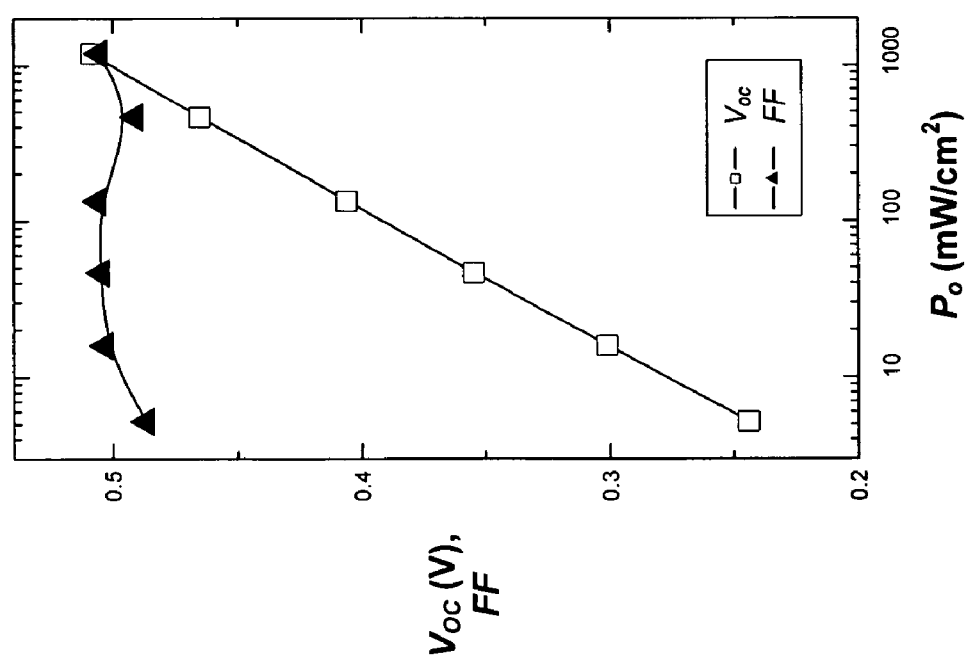
FIG. 19 illustrates cell fill factor (FF) and open-circuit voltage $V_{OC}$) as a function of illumination intensity for the same device as FIG. 14.

FIGS. 19 and 20 illustrate various photovoltaic cell performance parameters for the same device as a function of $P_0$. Here, FF~0.5 throughout the measured range of intensities, while the open circuit voltage ($V_{oc}$) increases logarithmically with $P_0$, having a value of 0.4 V at 1 sun (100 mW/cm²) and up to 0.51 V at 12 suns intensity. The responsivity (equal to $J_{SC}/P_0$, where $J_{SC}$ is the short-circuit current density) remains relatively constant with $P_0$=(0.05±0.02) A/W. As a result of these trends in device parameters, $\eta_P$ increases along with $V_{oc}$ to (1.0±0.1)% under 1 sun standard AM1.5G solar illumination, reaching (1.3±0.1)% under 12 suns. The fact that both FF and $J_{SC}P_0$ are constant with $P_0$ from 1 to 12 suns indicates that carrier collection in the device is efficient, and that carrier recombination does not increase significantly with intensity.

Figure 21:
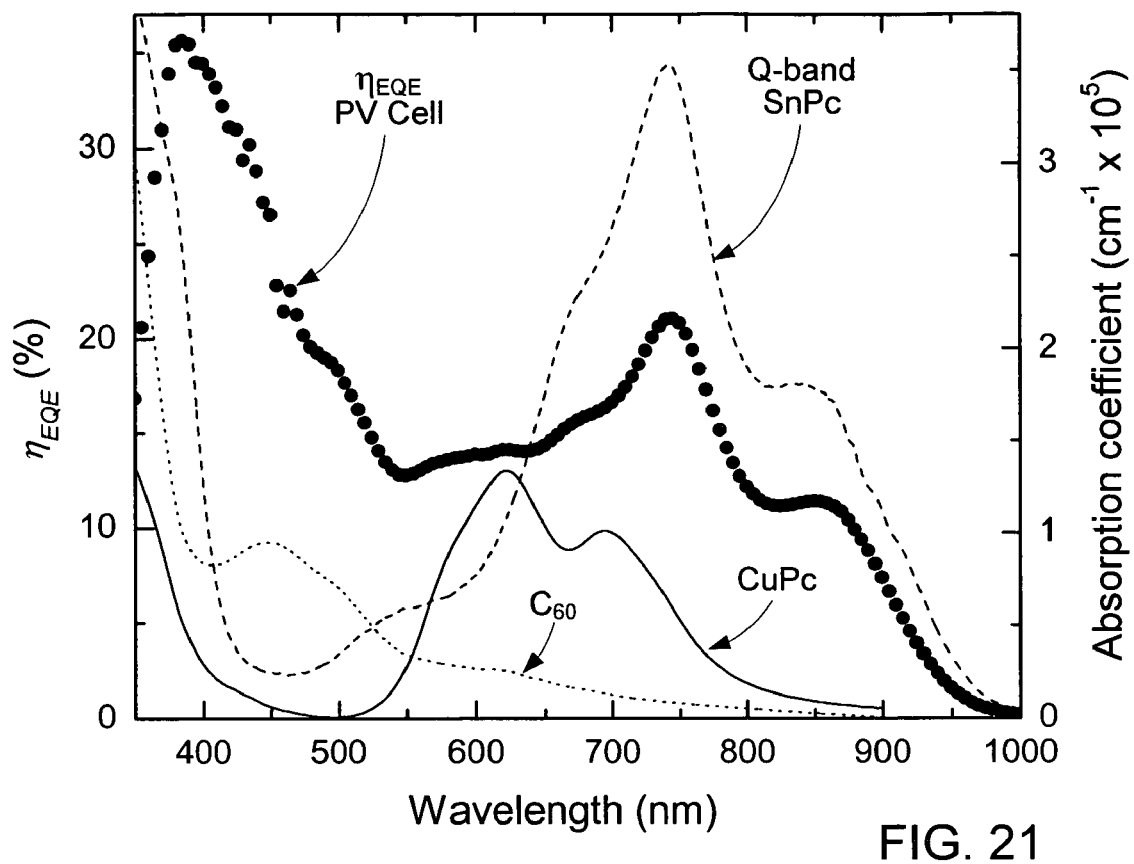
FIG. 21 illustrates external quantum efficiency and absorption coefficients as a function wavelength for the same device as FIG. 14.

The external quantum efficiency ($\eta_{EQE}$) and the absorption coefficients (α) of the active layers of the device are shown in FIG. 21 as functions of wavelength. The low energy Q-band of SnPc (dashed line) exhibits considerably stronger absorption than that of CuPc (solid line), reaching peak values of α=3.5×10⁵ cm⁻¹ at λ=740 nm, as opposed to 1.3×10⁵ cm⁻¹ at = 620 nm, respectively. Also, α for SnPc extends into the NIR, with significant absorption up to λ=1000 nm. The absorption coefficient was calculated from a 50-Å-thick film of SnPc; the same as that used in the device. Increasing the thickness of the film leads to a change in spectral shape, in that the peak at λ=860 nm increases with respect to the peak at 740 nm (data not shown), possibly a result of molecular aggregates forming SnPc dimers. That is, if we assume that the very thinnest SnPc layers do not provide uniform coverage of the surface, some regions will contain SnPc clusters with a high density of dimers, whereas other regions will have either monolayer or no coverage completely absent of dimers. In this case, the long wavelength aggregate peak intensity will also be reduced. The $\eta_{EQE}$ of the PV cell in FIG. 18 (filled circles, FIG. 21) follows the absorption of the constituent materials, with the photocurrent contribution from $C_{60}$ generated between 350<λ<550 nm, peaking at $\eta_{EQE}$=36%, while the SnPc layer contributes from 600<λ<1000 nm, peaking at 21%.

Optical modeling using transfer matrices (see L. A. A. Pettersson et al., Journal of Applied Physics 86, 487 (1999)) suggests that the SnPc region contributes to an internal quantum efficiency of ~40%. There are additional small response peaks in $\eta_{EQE}$ at λ=575 and 620 nm, corresponding to a contribution from the underlying CuPc layer. This latter response arises since the 50-Å-thick SnPc layer is discontinuous, allowing for local direct contact between the CuPc and $C_{60}$ that form efficient charge separating regions, further supporting our assumption of nonuniform layer coverage for the thinnest films. (See J. Xue et al., Applied Physics Letters 84; 3013-3015 (2004)).

Figure 22:
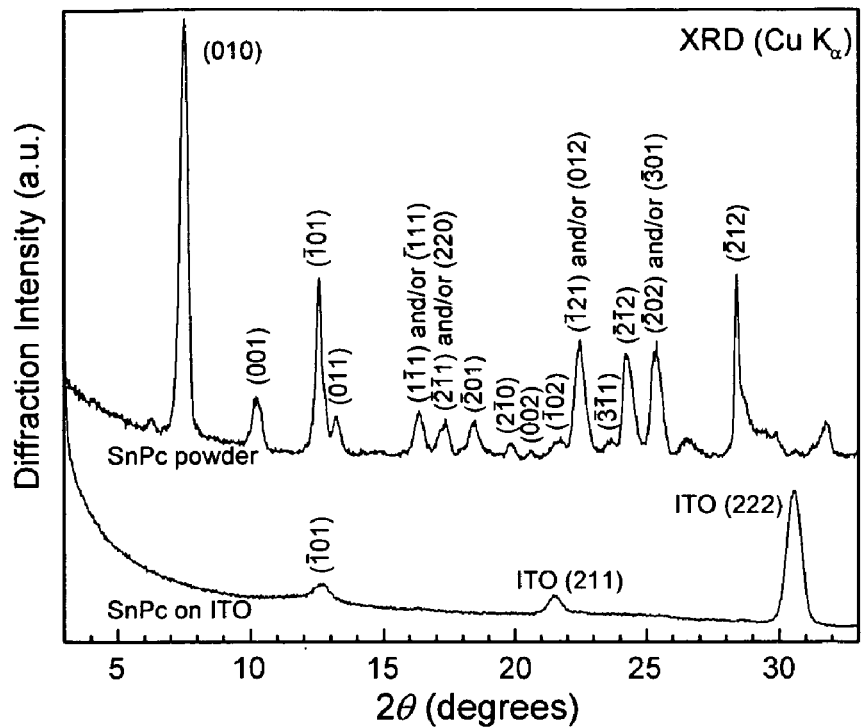
FIG. 22 illustrates the x-ray diffraction results for purified SnPc source material used for the thin photoactive layer, both as a powder and as deposited on ITO.

The central Sn atom lies 1.13 Å out of the molecular plane, causing SnPc to crystallize in the triclinic phase. (See M. K. Friedel et al., Chemical Communications, 400 (1970); and R. Kubiak et al., Journal of Alloys and Compounds 189, 107 (1992)). The powder x-ray diffraction of the purified source material is shown in FIG. 22, and the peaks are identified using the known molecular crystal structure. A 1000-Å-thick film of SnPc deposited on ITO is shown in FIG. 22 to have a single peak at 2θ=(12.60±0.05)°, corresponding to a lattice plane spacing of $d_{(\bar{1}01)}$=(7.03±0.02) Å. This indicates that the SnPc film is polycrystalline with molecules preferentially lying flat on the ITO surface, in agreement with past studies. (See K. Walzer et al., Surf. Sci. 471, 1 (2001); and L. B. Chen et al., Acta Phys. Sin. 45, 146 (1996)).

Figure 23:
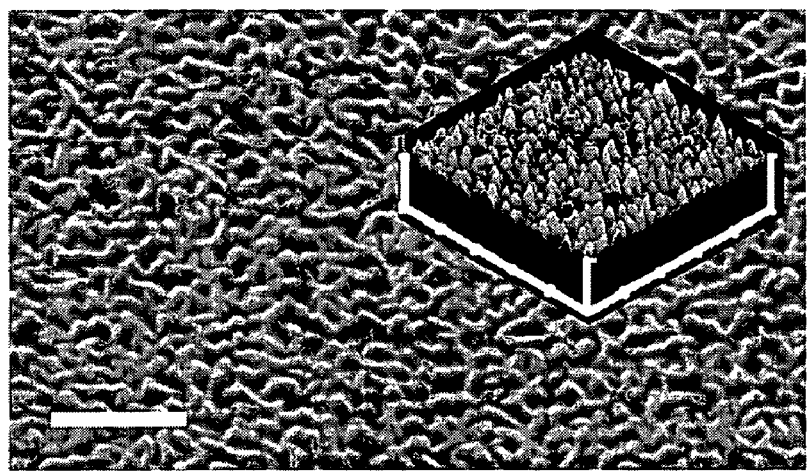
FIG. 23 illustrates the surface morphology of a 250 Å thick SnPc film on quartz.

FIG. 23 shows the surface morphology of a 250-Å-thick SnPc film on quartz. The scanning electron micrograph shows a rough, corrugated surface, indicative of a polycrystalline film, while the atomic force micrograph (FIG. 23, inset) yields a root mean square roughness of 47 Å.

The hole mobility in SnPc films was measured by fitting the space charge limited current of a ITO/SnPc(1000 Å)/Au device to Child's law, (see M. Pope and C. E. Swenberg, Electronic Processes in Organic Crystals and Polymers, 2nd ed. (Oxford University Press, New York, 1999); and B. P. Rand, J. Xue, S. Uchida, and S. R. Forrest, "Mixed donor-acceptor molecular heterojunctions for photovoltaic applications. I. Material properties," submitted to the Journal of Applied Physics on 9 Feb. 2005) assuming a relative dielectric constant of 3 for the organic. This analysis yields a hole mobility of $\mu_h$=(2±1)×10⁻¹⁰ cm²/Vs, as compared with CuPc which has $\mu_h$=(7±1)×10⁴ cm²/V·s (see B. P. Rand, J. Xue, S. Uchida, and S. R. Forrest, "Mixed donor-acceptor molecular heterojunctions for photovoltaic applications. I. Material properties," submitted to the Journal of Applied Physics on 9 Feb. 2005).

It is possible that the polycrystalline film of the nonplanar SnPc molecule has less molecular orbital overlap as compared with CuPc due to a larger intermolecular spacing. Indeed, the spacing between the planes formed by the four coordinating N atoms in SnPc alternates within a unit cell between 3.56 Å and 2.87 Å (see R. Kubiak et al., Journal of Alloys and Compounds 189, 107 (1992)), whereas it is 3.34 Å in the case of CuPc (see C. J. Brown, J. Chem. Soc. A, 2488 (1968)).

It is the larger of the two spacings in the SnPc lattice that determines the hole mobility, which may explain the significant differences in $\mu_h$ observed between these materials. The low mobility of SnPc results in increased series resistance, and hence a low FF in PV cells as the layer thickness is increased. That is, FF=0.5 for a 50-Å-thick SnPc layer (cf. FIG. 19), falling to 0.31 for a 200-Å-thick SnPc donor layer at 1 sun intensity. Depositing a 100-Å-thick CuPc wetting layer on the ITO surface prior to the SnPc deposition prevents the subsequent $C_{60}$ acceptor layer from directly contacting the ITO through discontinuities in the thin donor layer.

In summary, these experiments demonstrate the viability of an organic solar cell with sensitivity extending into the NIR, using SnPc as a thin sensitizing electron donor layer. Cell external quantum efficiency is significant for wavelengths between $350<\lambda<1000$ nm, remaining over 10% in the range of $350<\lambda<875$ nm. By optimizing layer thicknesses to retain good charge transport, and by placing the donor/acceptor interface in the region of highest incident light intensity, we achieve power conversion efficiencies of $(1.0\pm0.1)$% under 1 sun standard AM1.5G solar illumination, and up to $(1.3\pm0.1)$% under intense illumination. These results highlight the ability for the SnPc/$C_{60}$ junction to find use in tandem organic solar cells (see J. Xue, S. Uchida, B. P. Rand, and S. R. Forrest, Applied Physics Letters 85, 5757-5759 (2004); and B. P. Rand, P. Peumans, and S. R. Forrest, Journal of Applied Physics 96, 7519-7526 (2004)) to extend the responsivity of organic photovoltaic cells into the infrared.

As described above, organic photosensitive devices of the present invention may be used to generate electrical power from incident electromagnetic radiation (e.g., photovoltaic devices) or may be used to detect incident electromagnetic radiation (e.g., a photodetector or photoconductor cell).

Specific examples of the invention are illustrated and/or described herein. However, it will be appreciated that modifications and variations of the invention are covered by the above teachings and within the purview of the appended claims without departing from the spirit and scope of the invention.

What is claimed is:

1. A photosensitive device comprising:
a first electrode and a second electrode;
a series of organic photoactive layers disposed between the first electrode and the second electrode, each layer in the series being in direct contact with a next layer in the series, the series of organic photoactive layers being arranged to form at least one donor-acceptor heterojunction, the series comprising:
 a first organic photoactive layer comprising a first host material serving as a donor;
 a second organic photoactive layer comprising a second host material disposed between the first organic photoactive layer and a third organic photoactive layer, the third organic photoactive layer comprising a third host material serving as an acceptor; and
the second organic photoactive layer comprising a plurality of islands of the second host material, the first organic photoactive layer being in direct contact with the third organic photoactive layer in-between the islands, thus forming a first donor-acceptor heterojunction;
wherein the first host material, the second host material, and the third host material are different, and
wherein the second organic photoactive layer serves as an acceptor relative to the first organic photoactive layer, thus forming a second donor-acceptor heterojunction with the first organic photoactive layer or as a donor relative to the third organic photoactive layer, thus forming a third donor-acceptor heterojunction with the third organic photoactive layer, and a distance from any point within the second host material of the second organic photoactive layer to a boundary of that layer is not more than one exciton diffusion length over a majority of the area of the second organic photoactive layer.

2. The photosensitive device of claim 1, wherein a portion of the second organic photoactive layer further comprises a unitary layer having a plurality of openings, and the first organic photoactive layer is in direct contact with the third organic photoactive layer through said openings, thus forming the first donor-acceptor heterojunction.

3. The photosensitive device of claim 1, wherein said second host material is a small molecule.

4. The photosensitive device of claim 3, wherein said first host material and said third host material are small molecules.

5. The photosensitive device of claim 3, wherein the second host material has an absorption coefficient of at least $5\times10^4$ cm$^{-1}$ across a wavelength band from 600 nm to 900 nm.

6. The photosensitive device of claim 1, wherein each of the first organic photoactive layer, the second organic photoactive layer, and the third organic photoactive layer has a different absorption spectra.

7. The photosensitive device of claim 1, wherein the second organic photoactive layer serves as a donor, and the first host material and the second host material have different absorption spectra.

8. The photosensitive device of claim 7, wherein a HOMO of the second host material is no more than 0.16 eV above a HOMO of the first host material.

9. The photosensitive device of claim 7, wherein a band gap of the second host material is less than a band gap of the first host material.

10. The photosensitive device of claim 7, wherein the second host material has a hole mobility of less than $1\times10^{-9}$ cm$^2$/Vs and an absorption coefficient of at least $5\times10^4$ cm$^{-1}$ across a wavelength band from 600 nm to 900 nm.

11. The photosensitive device of claim 7, wherein the second host material is selected from tin (II) phthalocyanine (SnPc) and lead phthalocyanine (PbPc).

12. The photosensitive device of claim 11, wherein the third host material is $C_{60}$.

13. The photosensitive device of claim 1, wherein the second organic photoactive layer serves as an acceptor, and the second host material and the third host material have different absorption spectra.

14. The photosensitive device of claim 13, wherein a LUMO of the second host material is no more than 0.16 eV below a LUMO of the third host material.

15. The photosensitive device of claim 13, wherein a band gap of the second host material is less than a band gap of the third host material.

16. The photosensitive device of claim 1, wherein a thickness of the second organic photoconductive layer is not greater than 200 Å.

17. The photosensitive device of claim 16, wherein the thickness of the second organic photoconductive layer is not greater than 100 Å.

18. The photosensitive device of claim 1, wherein the second host material has an absorption coefficient of at least $5\times10^4$ cm$^{-1}$ across a wavelength band from 600 nm to 900 nm, and wherein at least a portion of the second organic photoactive layer is disposed at an optical path length of $\lambda_1 \cdot d + \lambda_1/4$ from a reflective surface of the device, where:
$\lambda_1$ is a wavelength in the wavelength band from 600 nm to 900 nm,
d is an integer $\geq 0$, and
the reflective surface is reflective to at least 50% of incident light at $\lambda_1$.

19. The photosensitive device of claim 18, wherein the reflective surface is provided by one of the first electrode, the second electrode, and a reflector.

20. The photosensitive device of claim 18, said series of organic photoactive layers being part of a first cell in a stack of photoactive cells disposed between the first electrode and the second electrode, the device further comprising a second cell of the stack of photoactive cells, the second cell comprising another donor-acceptor heterojunction, wherein the first cell and the second cell have different absorption characteristics, an average absorption of the first cell being greater than the average absorption of the second cell over a range of wavelengths $\lambda_1 \pm 5\%$, and an average absorption of the second cell being greater than the average absorption of the first cell over a range of wavelengths $\lambda_2 \pm 5\%$, where $\lambda_1 \geq \lambda_2 + 10\%$.

21. The photosensitive device of claim 1, the series of organic photoactive layers further comprising a bulk or mixed donor-acceptor layer disposed between the first organic photoactive layer and the third organic photoactive layer, said bulk or mixed donor-acceptor layer including both the first host material of the first organic photoactive layer and the third host material of the third organic photoactive layer.

22. The photosensitive device of claim 1, the series of organic photoactive layers further comprising a fourth organic photoactive layer comprising a fourth host material disposed between the first organic photoactive layer and the third organic photoactive layer, wherein the fourth host material is different from the first host material, the second host material, and the third host material, and wherein said fourth organic photoactive layer serves as an acceptor relative to the first organic photoactive layer or as a donor relative to the third photoactive layer, and a distance from any point within the fourth organic photoactive layer to a boundary of that layer is not more than one exciton diffusion length.

23. The photosensitive device of claim 1, wherein the distance from any point within the second host material of the second organic photoactive layer to a boundary of that layer is not more than one exciton diffusion length over an entirety of the area of the second organic photoactive layer.

24. The photosensitive device of claim 1, wherein the first organic photoactive layer comprises surface irregularities and the first and third organic photoactive layers being in direct contact as a result of an irregular coverage of the second organic photoactive layer caused by said surface irregularities and forming the first donor-acceptor heterojunction.

* * * * *